United States Patent
Srivastava et al.

(10) Patent No.: US 10,528,083 B1
(45) Date of Patent: Jan. 7, 2020

(54) MOBILE DEVICE COVER WITH INTEGRATED SOLAR PANEL

(71) Applicant: Microsoft Technology Licensing, LLC, Redmond, WA (US)

(72) Inventors: Ankit Srivastava, Bellevue, WA (US); Hari Pulapaka, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/149,866

(22) Filed: Oct. 2, 2018

(51) Int. Cl.
  *G06F 1/16* (2006.01)
  *H01L 31/042* (2014.01)
  *H02J 7/00* (2006.01)
  *H02S 20/30* (2014.01)

(52) U.S. Cl.
  CPC .......... *G06F 1/1635* (2013.01); *G06F 1/1662* (2013.01); *G06F 1/1681* (2013.01); *H01L 31/042* (2013.01); *H02J 7/0027* (2013.01); *H02S 20/30* (2014.12)

(58) Field of Classification Search
  CPC combination set(s) only.
  See application file for complete search history.

(56) References Cited

U.S. PATENT DOCUMENTS

| | | | | |
|---|---|---|---|---|
| 5,260,885 A * | 11/1993 | Ma | ................ | G06F 1/1626 136/245 |
| 5,522,943 A * | 6/1996 | Spencer | ................ | H01L 31/042 136/245 |
| 5,814,906 A * | 9/1998 | Spencer | ................ | G06F 1/1601 136/245 |
| 6,356,442 B1 * | 3/2002 | Lunsford | ................ | G06F 1/1626 312/223.2 |
| 6,535,199 B1 * | 3/2003 | Canova, Jr. | ................ | G06F 1/1626 345/156 |
| D601,492 S * | 10/2009 | Libassi | ................ | D13/102 |
| D662,041 S * | 6/2012 | Yang | ................ | D13/102 |
| 8,432,124 B2 * | 4/2013 | Foster | ................ | A45C 11/00 320/101 |
| 8,760,405 B2 * | 6/2014 | Nam | ................ | G06F 1/1616 345/169 |
| 8,816,957 B2 * | 8/2014 | Tu | ................ | G06F 1/263 136/245 |
| 8,988,354 B2 * | 3/2015 | Milhe | ................ | G06F 1/1671 345/168 |
| 9,118,195 B2 * | 8/2015 | Foster | ................ | H02J 7/0044 |
| 9,158,339 B2 * | 10/2015 | Luo | ................ | G06F 1/1635 |
| 9,335,793 B2 * | 5/2016 | Rothkopf | ................ | A45C 13/002 |
| 2004/0264126 A1 * | 12/2004 | Wells | ................ | G06F 1/203 361/679.46 |
| 2008/0092941 A1 * | 4/2008 | Kuo | ................ | G06F 1/1616 136/248 |
| 2008/0251338 A1 * | 10/2008 | Golden | ................ | A45C 11/00 190/100 |
| 2008/0283114 A1 * | 11/2008 | Gray | ................ | G06F 1/1628 136/245 |

(Continued)

*Primary Examiner* — Lisa Lea-Edmonds
(74) *Attorney, Agent, or Firm* — Klarquist Sparkman, LLP (57) ABSTRACT

A cover for a mobile device includes solar panels and an integrated keyboard. The solar panels are positioned on a stand of the cover and an angle associated with the solar panels can be changed so as to maximize input from a light source. The cover can be used to supply power and keyboard input to a mobile device while in use.

20 Claims, 7 Drawing Sheets

(56) References Cited

U.S. PATENT DOCUMENTS

| | | | | |
|---|---|---|---|---|
| 2009/0091885 A1* | 4/2009 | Burford | ............... | B41J 3/36 |
| | | | | 361/679.55 |
| 2009/0256520 A1* | 10/2009 | Frishman | ............ | H01M 2/1066 |
| | | | | 320/101 |
| 2014/0071606 A1* | 3/2014 | Bates | ............... | H01H 13/704 |
| | | | | 361/679.09 |
| 2014/0267050 A1* | 9/2014 | Spollen | ............... | G06F 3/0219 |
| | | | | 345/168 |
| 2015/0309587 A1* | 10/2015 | Lien | ............... | G06F 1/1635 |
| | | | | 345/169 |
| 2016/0224238 A1* | 8/2016 | Rothkopf | ............ | A45C 13/002 |
| 2017/0040932 A1* | 2/2017 | Lillywhite | ............ | H02S 20/30 |

\* cited by examiner

MOBILE DEVICE COVER WITH INTEGRATED SOLAR PANEL

BACKGROUND

Battery life of a mobile device is key feature for sales. Reviews compare which mobile device has the longest battery life, articles are written how to extend battery life, and applications are available to analyze mobile devices to determine how to save battery life.

Some solutions use solar cells to charge the mobile device while a user stores the mobile device, such as in a carrying bag. However, generally such solutions are not available while using the device.

A solution is needed for extending battery life of mobile devices.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, a cover is provided for a mobile device that includes one or more integrated solar panels. The cover can be used as a stand and the stand has the solar panels positioned so that the solar panels can charge while using the mobile device.

In another embodiment, the cover includes an integrated keyboard that can be used while the mobile device is being charged by the solar panels.

In still another embodiment, a battery can be integrated into the cover and can charge via the solar panels. The battery can then be used to extend a life of the mobile device between charges.

The foregoing and other objects, features, and advantages will become more apparent from the following detailed description, which proceeds with reference to the accompanying figures.

DETAILED DESCRIPTION

A cover for a mobile device includes solar panels and an integrated keyboard. The solar panels are positioned on a stand of the cover and an angle associated with the solar panels can be changed so as to maximize input from a light source. The cover can be used to supply power and keyboard input to a mobile device while in use. In some applications, the cover can be used indoors so that the solar panels can receive flux generated from any artificial sources of light so as to charge the mobile device directly or to charge a battery positioned on the cover.

Figure 1:
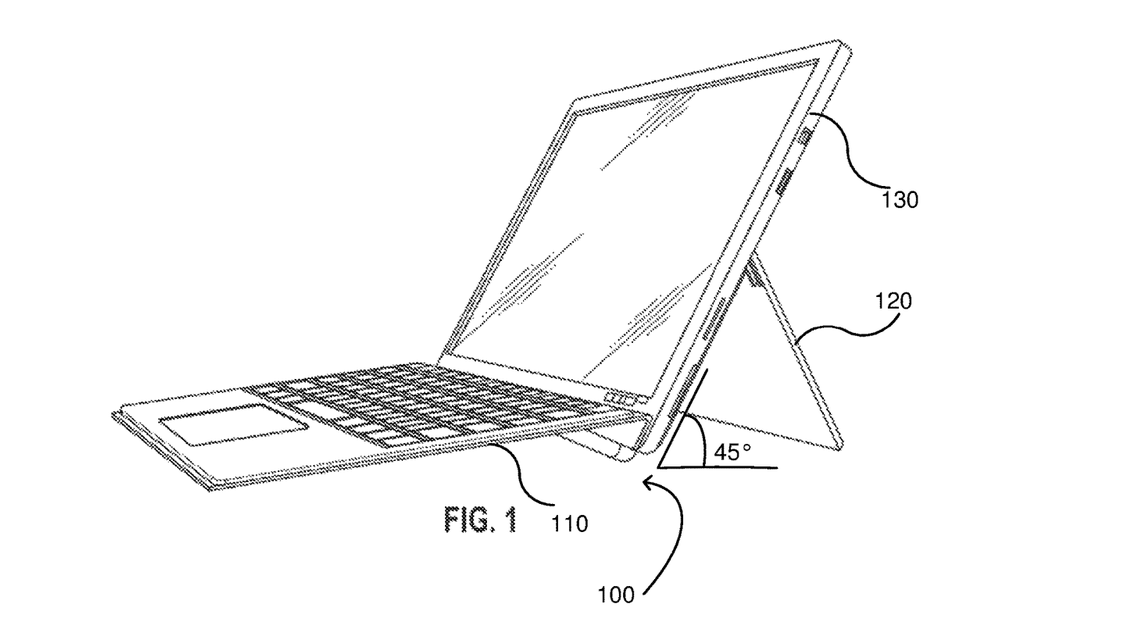
FIG. 1 shows a cover including an integrated keyboard and a stand for supporting a mobile device at a viewing angle with respect to a horizontal service.

FIG. 1 is an embodiment of a cover 100 having a keyboard portion 110 and a stand portion 120. The cover 100 can be used to maintain a mobile device, such as a tablet 130, at a desired angle, such as 45 degrees with respect to a horizontal. Although a tablet 130 is shown, the mobile device can be any of a variety of computing devices (e.g., cell phone, smartphone, handheld computer, Personal Digital Assistant (PDA), etc.) and can allow wireless two-way communications with one or more mobile communications networks (not shown).

Figure 2:
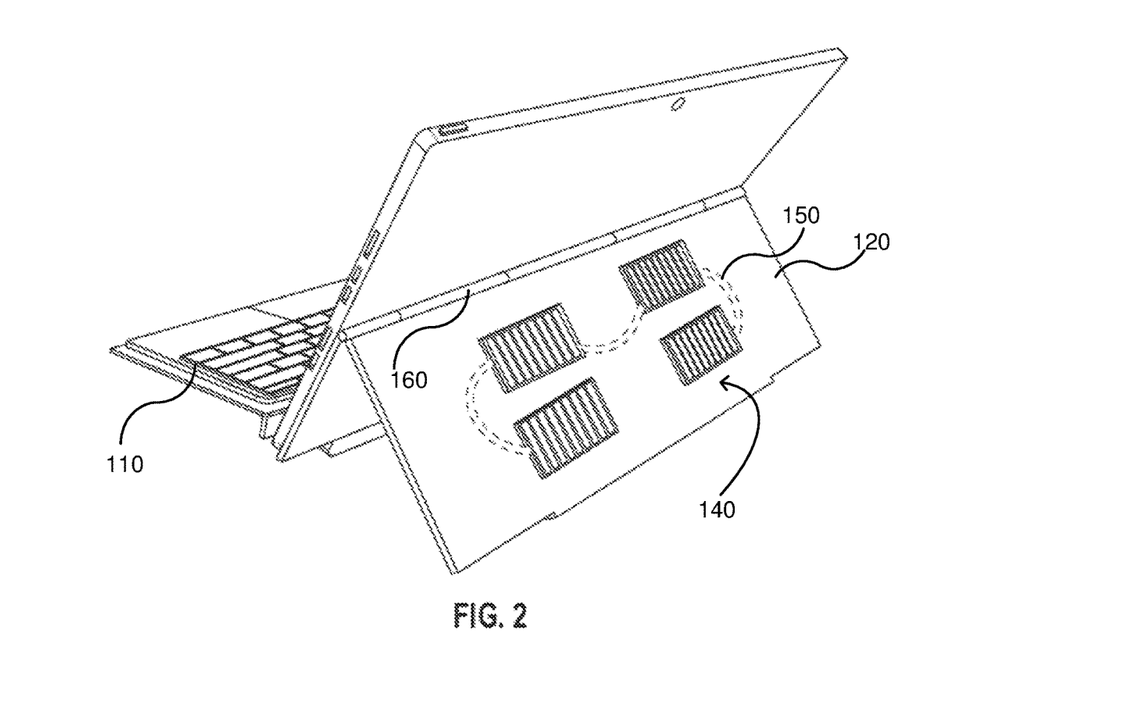
FIG. 2 shows the cover of FIG. 1 with the stand having one or more solar panels thereon for charging the mobile device.
Figure 4:
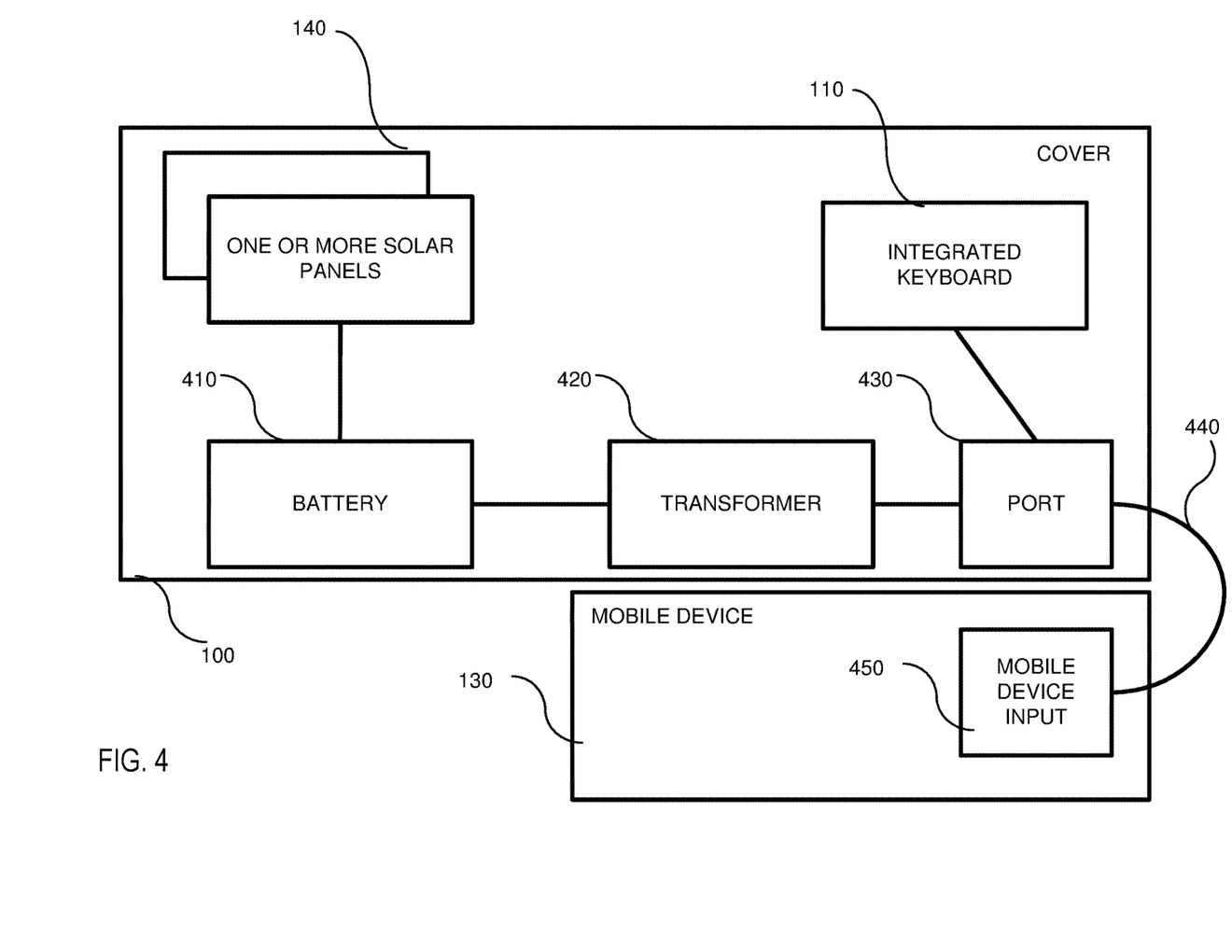
FIG. 4 shows an embodiment of an electrical diagram for the cover.
Figure 5:
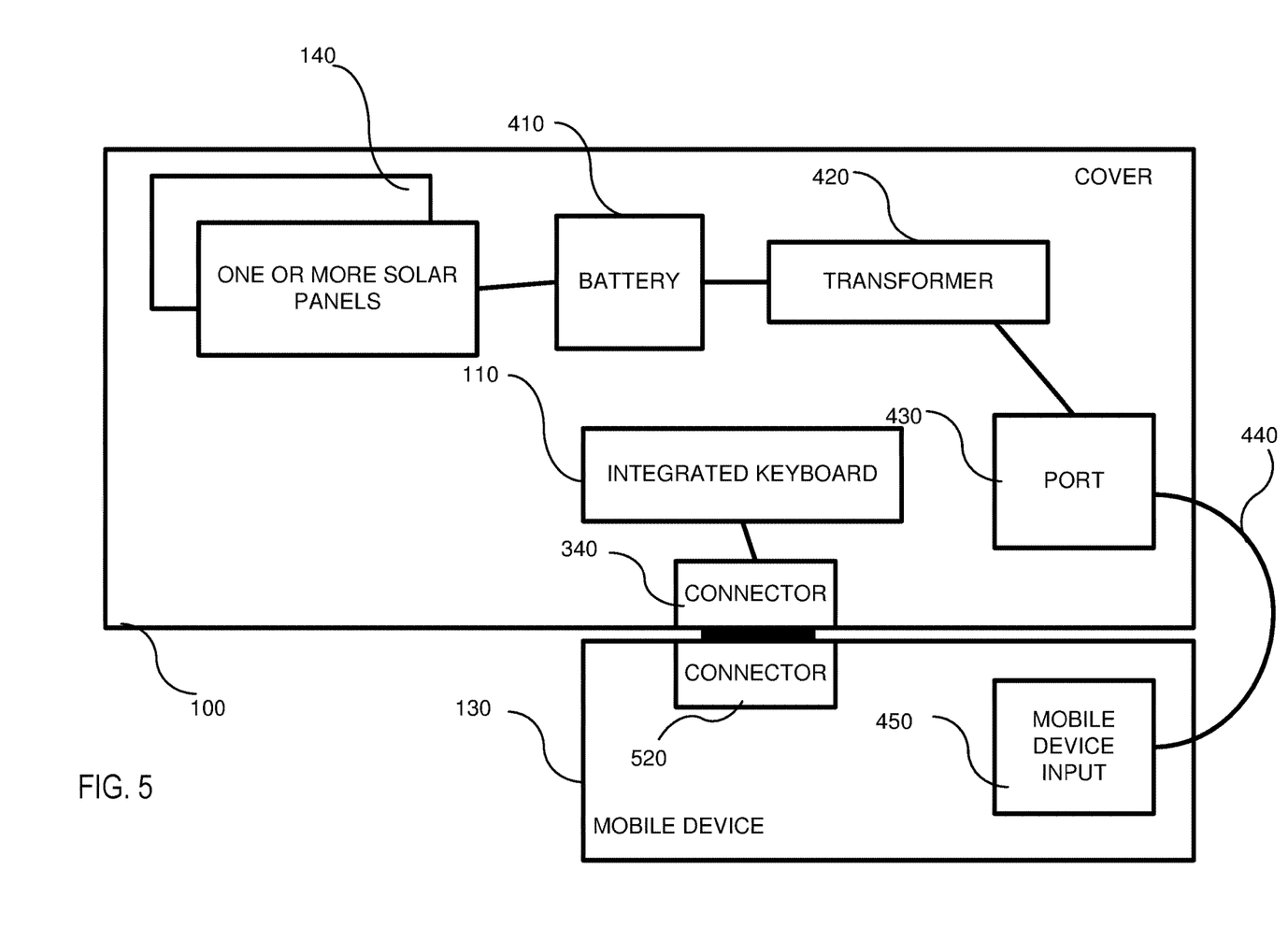
FIG. 5 shows another embodiment of an electrical diagram for the cover.
Figure 6:
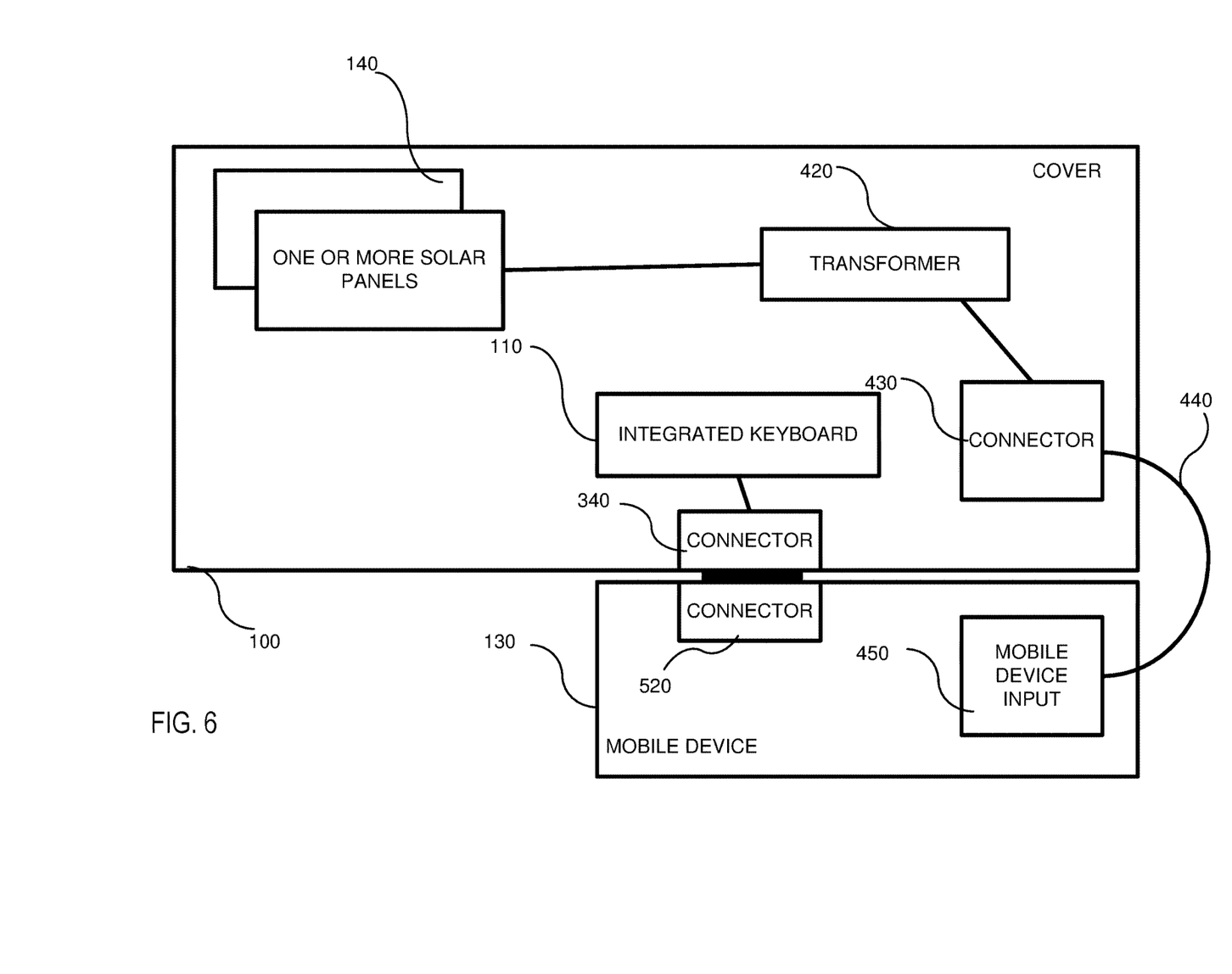
FIG. 6 shows yet another embodiment of an electrical diagram for the cover.

FIG. 2 shows the stand 120 in more detail. The stand 120 includes one or more solar panels 140 coupled in series by conductors 150 (shown in dashed to indicate that they can be hidden). Other electrical components (not shown) are also included on the cover 100, but are not shown in FIG. 2 for ease of illustration. However, additional electrical components are shown in FIGS. 4-6 and are described below. Generally, the solar panels 140 are positioned such that light can charge the panels while the mobile device 130 is in a usable position, such that the stand 120 props the mobile device at an angle, such as at 45 degrees, as shown in FIG. 1. Although multiple solar panels 140 are shown, a single solar panel can be used instead. Indeed, the entire stand 120 can be a solar panel. Conversely, a larger number of solar panels can also be used, rather than the four panels shown. The solar panels can be any of a variety of solar panels including monocrystalline solar panels, polycrystalline solar panels, thin-film amorphous silicon solar panels and/or concentrated PV cell solar panels. Other types of solar panels can be used.

The stand 120 is rotatably coupled to the rest of the cover via a hinge 160 that allows the stand to be adjusted to change an angle at which the mobile device is propped relative to a horizontal. The hinged stand 120 thereby allows a user to adjust an angle at which the solar panels sit so as to maximize exposure to light while simultaneously allowing the user to adjust a viewing angle of the mobile device. The keyboard can be any of a variety of keyboard types including a standard laptop keyboard, an ergonomics keyboard, etc.

Figure 3:
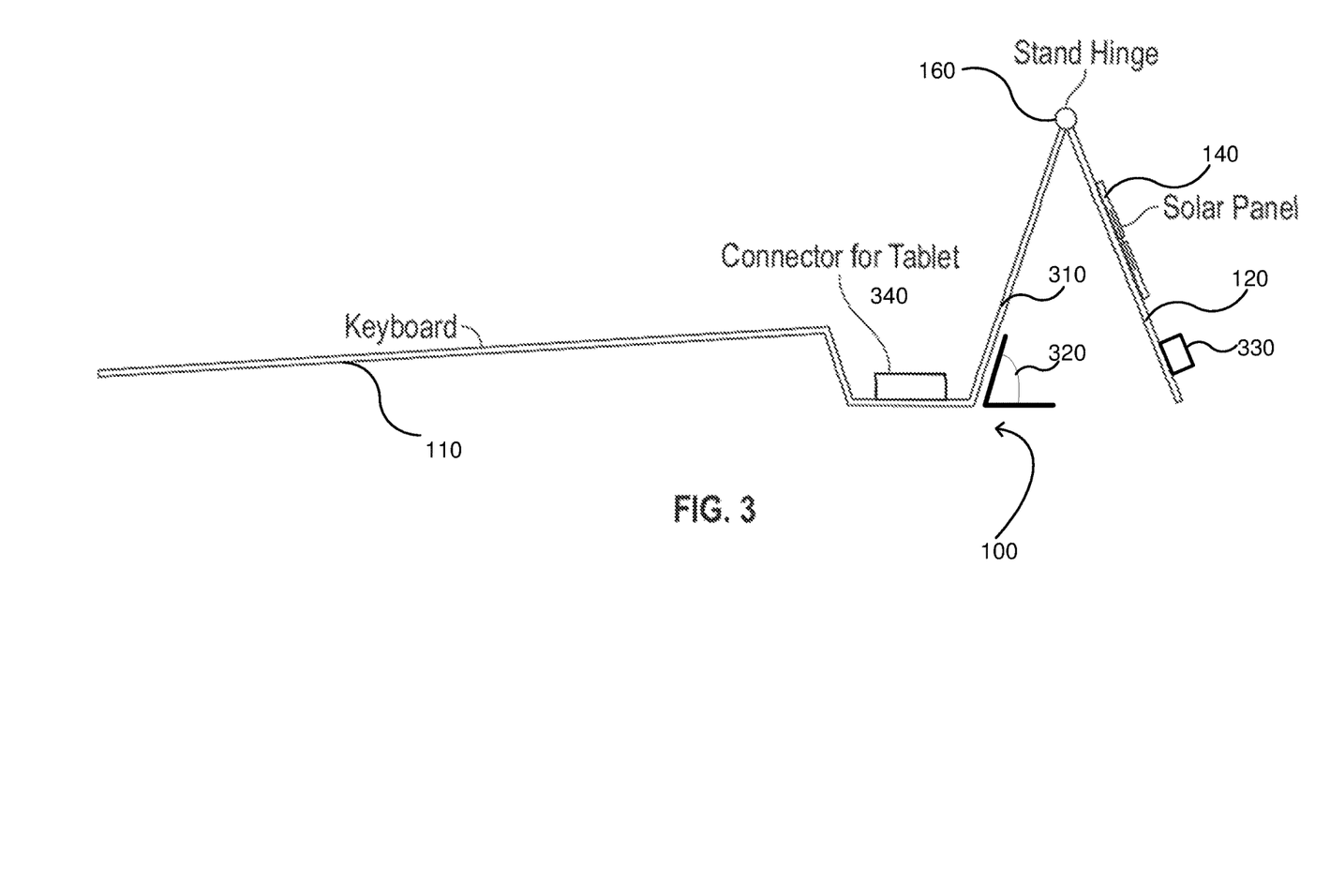
FIG. 3 shows a side view of the cover including the solar panel.

FIG. 3 shows the cover 100 without the mobile device 130. The cover 100 includes the integrated keyboard 110, the stand 120, the one or more solar panels 140, and the hinge 160, as previously described. To support the mobile device when inserted, the cover 100 includes a back portion 310 also coupled to the hinge 160. The back portion 310 cooperates with the stand 120 to change the angle 320, which changes an angle of viewing the mobile device. The hinge 160 further allows a user to change the angle at which the solar panels on the stand sit with respect to the horizontal. There are two different ports shown for coupling the cover 100 to the mobile device. A first port 330 includes a power pin for charging the mobile device using the solar panels 140. The first port 330 can be a wide variety of types of ports including USB-type ports, or other serial ports. A second port 340 can be used to receive input from the keyboard 110. The two ports 330, 340 can be merged into a single port, which combines both parallel keyboard input data and power. For example, the connector 340 can include a power pin coupled to the solar panels 140 so as to provide solar panel charge and keyboard input data in parallel in a single connector.

FIG. 4 is an example electrical diagram of the cover 100 according to one embodiment. The electrical components illustrated in FIG. 4 can be positioned anywhere on the cover 100, such as on the stand 120. In this embodiment, the one or more solar panels 140 are coupled to a battery 410. The solar panels 140 can charge the battery 410 whether or not the mobile device 130 is coupled to the cover 100. The battery 410 is coupled to a step-up transformer 420. The transformer 420 converts a voltage level from the battery 410 to a desired voltage level needed for the mobile device 130. The transformer 420 can be coupled to a port 430, which in this case is an integrated port that receives both input from the keyboard 110 and the transformer 420. A cable 440 can be used to couple the port to a mobile device input 450. The mobile device 130 can thereby receive keyboard input and power from the cover 140 simultaneously through a single port 430.

FIG. 5 is an electrical diagram of the cover 100 according to another embodiment. Similar to the embodiment of FIG. 4, the cover includes the one or more solar panels 140 coupled to a battery 410, which in turn is coupled to a transformer 420. An output of the transformer 420 is coupled to the port 430. A cable 440 can couple the port 430 to a mobile device input 450 for charging the mobile device. The cover can include the integrated keyboard 110 coupled to the connector 340 for outputting keyboard data. The mobile device 130 includes a connector 520 that mates with connector 340 so that the keyboard data can be passed between the cover 100 and the mobile device 130. Thus, in this embodiment, power is passed through a different port 430 than connector 340 (which can also be called a "port").

FIG. 6 is an electrical diagram of the cover 100 according to yet another embodiment. In this embodiment, the battery 410 (of FIG. 5) is eliminated. As a result, the one or more solar panels 140 are coupled directly to the transformer 420 for supplying power to the connector 430, and ultimately to the mobile device 130 via the cable 440. The connectors 340, 520 are similar to FIG. 5 and are not further explained for purposes of brevity. Thus, the solar panels 140 provide power in real-time to the mobile device 130 in the embodiment of FIG. 6. Additionally, by eliminating the battery, the cover 100 can be made lighter and less expensive.

Figure 7:
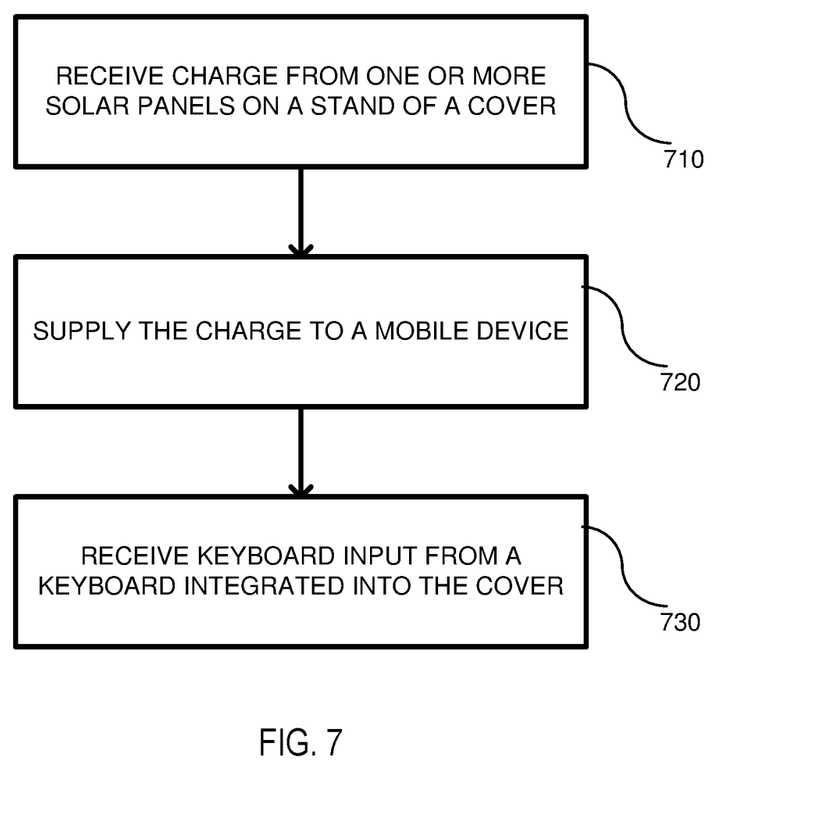
FIG. 7 is a flowchart according to one embodiment for supplying charge to a mobile device using solar panels positioned on a cover.

FIG. 7 is a flowchart according to one embodiment for charging a mobile device using a cover. In process block 710, a charge is received from one or more solar panels on a stand of a cover. For example, in FIG. 1 the solar panels 140 on the stand 120 can provide charge and other components on the cover can receive the charge, such as the battery 410 or the transformer 420. In process block 720, the charge is supplied to a mobile device. For example, a port 430 can be used to supply the charge to the mobile device 130 for powering the mobile device. In process block 730, keyboard input is received from a keyboard integrated into the cover. For example, the connector 340 or the port 430 can receive the keyboard input data and pass the data to the mobile device 130 during use of the mobile device. In this way, a user that is currently using the mobile device can simultaneously supply power and keyboard data through the cover 100.

Figure 8:
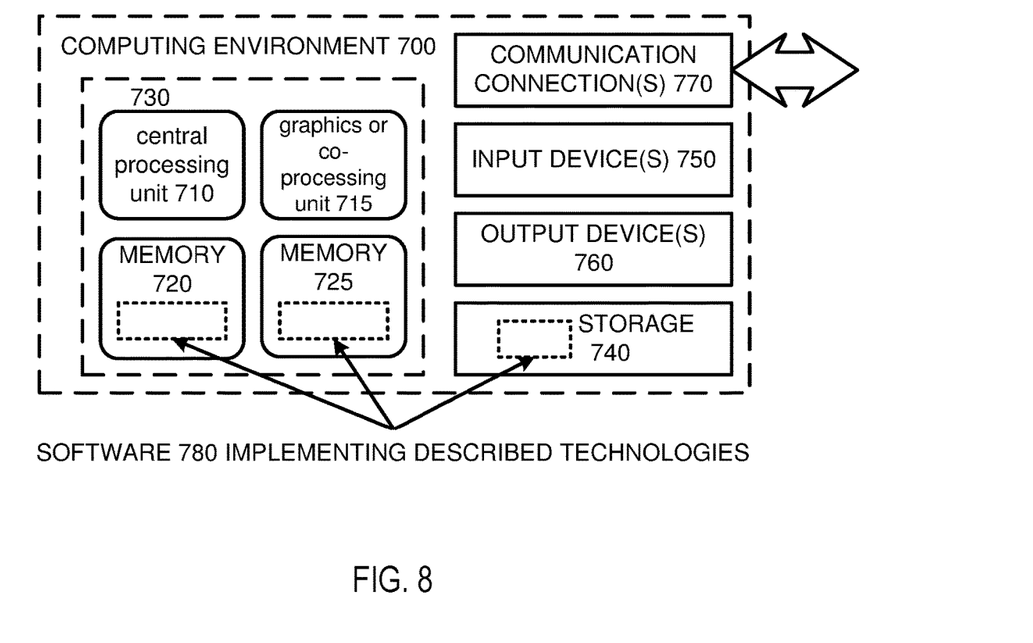
FIG. 8 depicts a generalized example of a suitable computing environment that can be used in cooperation with the described innovations.

FIG. 8 depicts a generalized example of a suitable computing environment 800 in which the described innovations may be implemented. The computing environment 800 is not intended to suggest any limitation as to scope of use or functionality, as the innovations may be implemented in diverse general-purpose or special-purpose computing systems. For example, the computing environment 800 can be any of a variety of computing devices (e.g., desktop computer, laptop computer, server computer, tablet computer, media player, gaming system, mobile device, etc.) The computing environment 800 can be a mobile device that includes the cover described herein.

With reference to FIG. 8, the computing environment 800 includes one or more processing units 810, 815 and memory 820, 825. In FIG. 8, this basic configuration 830 is included within a dashed line. The processing units 810, 815 execute computer-executable instructions. A processing unit can be a general-purpose central processing unit (CPU), processor in an application-specific integrated circuit (ASIC) or any other type of processor. In a multi-processing system, multiple processing units execute computer-executable instructions to increase processing power. For example, FIG. 8 shows a central processing unit 810 as well as a graphics processing unit or co-processing unit 815. The tangible memory 820, 825 may be volatile memory (e.g., registers, cache, RAM), non-volatile memory (e.g., ROM, EEPROM, flash memory, etc.), or some combination of the two, accessible by the processing unit(s). The memory 820, 825 stores software 880 implementing one or more innovations described herein, in the form of computer-executable instructions suitable for execution by the processing unit(s).

A computing system may have additional features. For example, the computing environment 800 includes storage 840, one or more input devices 850, one or more output devices 860, and one or more communication connections 870. An interconnection mechanism (not shown) such as a bus, controller, or network interconnects the components of the computing environment 800. Typically, operating system software (not shown) provides an operating environment for other software executing in the computing environment 800, and coordinates activities of the components of the computing environment 800.

The tangible storage 840 may be removable or non-removable, and includes magnetic disks, magnetic tapes or cassettes, CD-ROMs, DVDs, or any other medium which can be used to store information in a non-transitory way and which can be accessed within the computing environment 800. The storage 840 stores instructions for the software 880 implementing one or more innovations described herein.

The input device(s) 850 may be a touch input device such as a keyboard, mouse, pen, or trackball, a voice input device, a scanning device, or another device that provides input to the computing environment 800. For video encoding, the input device(s) 850 may be a camera, video card, TV tuner card, or similar device that accepts video input in analog or digital form, or a CD-ROM or CD-RW that reads video samples into the computing environment 800. The output device(s) 860 may be a display, printer, speaker, CD-writer, or another device that provides output from the computing environment 800.

The communication connection(s) 870 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

Methods can be implemented as computer-executable instructions stored on one or more computer-readable storage media (e.g., one or more optical media discs, volatile memory components (such as DRAM or SRAM), or non-volatile memory components (such as flash memory or hard drives)) and executed on a computer (e.g., any commercially available computer, including smart phones or other mobile devices that include computing hardware). The term computer-readable storage media does not include communication connections, such as signals and carrier waves. Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in C++, Java, Perl, JavaScript, Adobe Flash, or any other suitable programming language. Likewise, the disclosed technology is not limited to any particular computer or type of hardware. Certain details of suitable computers and hardware are well known and need not be set forth in detail in this disclosure.

It should also be well understood that any functionality described herein can be performed, at least in part, by one or more hardware logic components, instead of software. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), etc.

The disclosed methods, apparatus, and systems should not be construed as limiting in any way. Instead, the present disclosure is directed toward all novel and nonobvious features and aspects of the various disclosed embodiments, alone and in various combinations and subcombinations with one another. The disclosed methods, apparatus, and systems are not limited to any specific aspect or feature or combination thereof, nor do the disclosed embodiments require that any one or more specific advantages be present or problems be solved.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope of these claims.

We claim:

1. A cover of a mobile device, comprising:
   a cover body;
   one or more solar panels integrated into the cover body;
   a keyboard forming part of the cover body, the keyboard configured as an input device to the mobile device; and
   a port on the cover body for coupling the one or more solar panels to the mobile device;
   a battery coupled to the one or more solar panels for storing charge from the solar panels, the battery further being coupled to the port for charging the mobile device.

2. The cover of claim 1, wherein the one or more solar panels are positioned on a stand used to hold the mobile device upright at a selectable angle relative to a flat surface so that the solar panels are configured to charge the mobile device using flux generated by an artificial source of light.

3. The cover of claim 1, wherein the port is a first port and further including a second port on the cover body for coupling the keyboard to the mobile device.

4. The cover of claim 1, wherein the port is configured to couple the keyboard to the mobile device in addition to coupling the one or more solar panels to the mobile device.

5. The cover of claim 1, further including a transformer coupled between the one or more solar panels and the port to convert a voltage from the one or more solar panels to a voltage used by the mobile device.

6. A cover, comprising:
   a stand for supporting a mobile device in an upright position relative to a horizontal surface;
   a solar panel positioned on the stand;
   a transformer coupled to the solar panel to convert voltage from the solar panel to a voltage compatible with the mobile device; and
   a port coupled to the transformer adapted to receive a cable for electrically coupling an output of the transformer to the mobile device.

7. The cover of claim 6, further including a keyboard integrated into the cover and coupled to the stand.

8. The cover of claim 7, wherein the keyboard is electrically coupled to the port for transmitting keyboard input to the mobile device.

9. The cover of claim 7, wherein the port is a first port and further including a second port positioned on the cover for transmitting input from the keyboard to the mobile device.

10. The cover of claim 6, further including a battery positioned on the cover and electrically coupled between the solar panel and the transformer for storing charge from the solar panel and for transmitting the charge to the port.

11. The cover of claim 6, wherein the solar panel is positioned on the stand so as to receive flux generated from an artificial light source while the mobile device is being used.

12. The cover of claim 6, further including a back wall to support the mobile device in the upright position and a hinge coupled to the stand so as to allow the stand to rotate relative to back wall.

13. The cover of claim 12, wherein a position of the stand is adjustable so as to change an angle of the solar panel relative to the mobile device so that the solar panel can be charged from flux generated by an artificial source of light.

14. A method of charging a mobile device, comprising:
- receiving charge from one or more solar panels positioned on a stand of a cover of the mobile device;
- supplying the charge to the mobile device for charging the mobile device; and
- receiving keyboard input from a keyboard integrated into the cover.

15. The method of claim 14, further including transmitting the keyboard input to the mobile device.

16. The method of claim 15, wherein the keyboard input is transmitted through a separate port than the charge.

17. The method of claim 14, wherein the stand is coupled to a hinge so as to allow the mobile device connected to the cover to stand at an angle relative to a horizontal surface.

18. The method of claim 14, further including charging a battery integrated into the cover, wherein the battery performs the supplying of the charge to the mobile device.

19. The method of claim 14, further including transforming a voltage of the one or more solar panels to a voltage compatible with the mobile device.

20. A cover of a mobile device, comprising:
- a cover body;
- one or more solar panels integrated into the cover body;
- a keyboard forming part of the cover body, the keyboard configured as an input device to the mobile device; and
- a port on the cover body for coupling the one or more solar panels to the mobile device;
- wherein the one or more solar panels are positioned on a stand used to hold the mobile device upright at a selectable angle relative to a flat surface so that the one or more solar panels are configured to charge the mobile device using flux generated by an artificial source of light.

* * * * *